United States Patent
Patapoutian et al.

(10) Patent No.: US 8,166,364 B2
(45) Date of Patent: Apr. 24, 2012

(54) LOW DENSITY PARITY CHECK DECODER USING MULTIPLE VARIABLE NODE DEGREE DISTRIBUTION CODES

(75) Inventors: Ara Patapoutian, Hopkinton, MA (US); Arvind Sridharan, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 933 days.

(21) Appl. No.: 12/185,437

(22) Filed: Aug. 4, 2008

(65) Prior Publication Data
US 2010/0031115 A1 Feb. 4, 2010

(51) Int. Cl.
G06F 11/00 (2006.01)
(52) U.S. Cl. .......... 714/752; 714/6.24; 714/809
(58) Field of Classification Search .......... None
See application file for complete search history.

(56) References Cited

U.S. PATENT DOCUMENTS

| Patent No. | Date | Inventor | Ref |
|---|---|---|---|
| 6,381,273 B1 * | 4/2002 | Law et al. | 375/240 |
| 6,789,227 B2 | 9/2004 | De Souza et al. | |
| 6,938,196 B2 * | 8/2005 | Richardson et al. | 714/752 |
| 6,957,375 B2 | 10/2005 | Richardson | |
| 7,103,825 B2 | 9/2006 | Yedidia et al. | |
| 7,139,964 B2 | 11/2006 | Shen et al. | |
| 7,197,690 B2 | 3/2007 | Shen et al. | |
| 7,237,171 B2 | 6/2007 | Richardson | |
| 7,263,651 B2 | 8/2007 | Xia et al. | |
| 7,318,186 B2 | 1/2008 | Yokokawa et al. | |
| 7,353,444 B2 | 4/2008 | Owsley et al. | |
| 7,373,585 B2 | 5/2008 | Yedidia et al. | |
| 7,383,493 B2 * | 6/2008 | Shen et al. | 714/801 |
| 7,395,490 B2 | 7/2008 | Richardson et al. | |
| 7,398,455 B2 | 7/2008 | Eroz et al. | |
| 7,526,717 B2 * | 4/2009 | Kyung et al. | 714/800 |
| 7,673,223 B2 * | 3/2010 | Richardson et al. | 714/780 |
| 2004/0187129 A1 | 9/2004 | Richardson | |
| 2004/0199859 A1 | 10/2004 | Matsumoto | |
| 2005/0138516 A1 * | 6/2005 | Yedidia | 714/746 |
| 2005/0149843 A1 | 7/2005 | Shen | |
| 2005/0229091 A1 | 10/2005 | Narayanan | |
| 2007/0089025 A1 | 4/2007 | Hong et al. | |
| 2007/0101246 A1 * | 5/2007 | Kyung et al. | 714/804 |
| 2007/0202889 A1 | 8/2007 | Kim et al. | |
| 2008/0028272 A1 | 1/2008 | Richardson | |
| 2008/0163027 A1 | 7/2008 | Richardson | |
| 2010/0037125 A1 * | 2/2010 | Argon et al. | 714/800 |
| 2010/0070818 A1 * | 3/2010 | Ulriksson | 714/752 |
| 2010/0272011 A1 * | 10/2010 | Palanki et al. | 370/328 |
| 2011/0307755 A1 * | 12/2011 | Livshitz et al. | 714/752 |

* cited by examiner

Primary Examiner — Christopher McCarthy
(74) Attorney, Agent, or Firm — Braden Katterheinrich

(57) ABSTRACT

A decoding system comprises an iterative decoder that utilizes parity constraints to iteratively decode a block of data that consists of multiple code words, and a processor that controls the iterative decoder to selectively remove a subset of the parity constraints for a number of decoder iterations and include one or more of the selectively removed parity constraints in other decoder iterations.

22 Claims, 4 Drawing Sheets

LOW DENSITY PARITY CHECK DECODER USING MULTIPLE VARIABLE NODE DEGREE DISTRIBUTION CODES

BACKGROUND OF THE INVENTION

1. Field of the Invention

The invention relates generally to low density parity check decoders.

2. Background Information

Low density parity check (LDPC) codes are a class of linear error correction codes (ECCs) that can be decoded efficiently with iterative decoders. The decoders can be represented by Tanner graphs, in which variable nodes that correspond to code word symbols, or vectors of symbols, and parity constraint nodes that correspond to parity constraints are interconnected by edges that represent the inclusion of the code word symbols in the respective parity constraints. The LDPC codes can be referred to by variable node degree distributions, which relate to the number of edges connecting to the respective variable nodes. For example, a code may have a variable node degree distribution in which x percent of the variable nodes are degree three and 100-x percent are degree four. The degrees of the respective variable nodes in the example indicate that corresponding code word symbols are associated with three or four parity constraints. An LDPC code has a higher variable node degree distribution if it has a larger number of higher degree variable nodes.

The parity constraint nodes are also denoted by degrees, which indicate the number of code word symbols that are included in associated parity check equations. The LDPC code could instead be represented by a parity check H matrix.

When contrasted with other linear ECCs, such as Reed Solomon codes, the LDPC codes have good dB performance, that is, perform well in low signal-to-noise situations. However, the LDPCs also have relatively high error floors, or sector failure rates, that remain relatively constant even at higher signal-to-noise ratios. In the channels of interest, error floors are lower for LDPC codes that have higher degree variable nodes. There is thus a trade off involve in optimizing either for better dB performance or lower error floors. Generally, data storage systems must meet prescribed sector failure rate minimums, and the LDPC codes are selected based on their error floors. The same trade off occurs with respect to the burst error correction capabilities of the LDPC codes.

SUMMARY OF THE INVENTION

A decoding system comprises an iterative decoder that is characterized by a plurality of variable nodes and a plurality of parity constraint nodes, and a processor that at respective iterations disables one or more selected parity constraint nodes to operate the iterative decoder with a selected variable node degree distribution code and at other iterations enables one or more of the selected parity constraint nodes to operate the iterative decoder with one or more higher variable node degree distribution codes.

A decoding method comprises the steps of disabling one or more selected parity constraint nodes and operating an iterative decoder with a selected variable node degree distribution code, performing a number of iterations, enabling one or more of the selected parity constraint nodes and operating the iterative decoder with one or more higher variable node degree distribution codes.

A decoding system comprises an iterative decoder that utilizes parity constraints to iteratively decode a block of data that consists of multiple code words, and a processor that controls the iterative decoder to selectively remove a subset of the parity constraints for a number of decoder iterations and include one or more of the selectively removed parity constraints in other decoder iterations.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
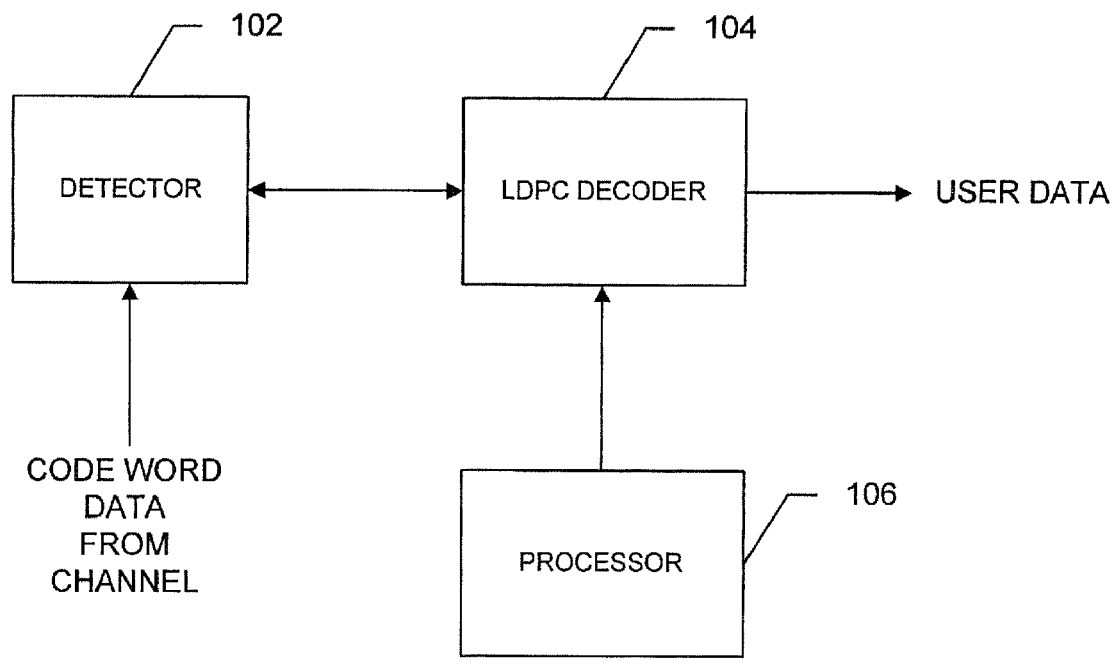
FIG. 1 is a functional block diagram of a decoding system constructed in accordance with the invention.

Referring to FIG. 1, a decoding system 100 includes an intersymbol interference (ISI) a detector 102, such as a Viterbi detector, and an iterative decoder 104, referred to in the drawing as an LDPC decoder. The detector 102 receives a block of code word data from a magnetic recording channel (not shown) and in a known manner provides corresponding soft information to the LDPC decoder. A processor 106 controls the LDPC decoder to operate the decoder utilizing, for a given number of decoder iterations, a selected variable node degree distribution LDPC code.

The LDPC decoder 104, under the control of the processor 106, performs up to a predetermined number of decoder iterations using the selected variable node degree distribution LDPC code. If the code word data do not converge, the decoder supply updated soft information to the detector 102. The detector then operates in a known manner to further update the soft information and provide the further updated information to the decoder 104.

The processor controls the LDPC decoder 104, such that the decoder performs a predetermined number of further decoder iterations using the same selected variable node degree distribution LDPC code or, as appropriate, one or more different variable node degree distribution LDPC codes. If the code word data still do not converge, the decoder may again supply updated soft information to the detector, which repeats its detecting and updating operations and supplies the results to the decoder. The processor 106 then determines the variable node degree distribution of the LDPC code or codes to be used in the next decoder iterations, and the decoder performs the iterations. The exchange of updated soft information between the decoder and the detector continues, as do the decoder iterations performed by the decoder under the control of the processor 106, until the data converges or a stop condition is met. The operations of the processor are discussed in more detail below.

Figure 2:
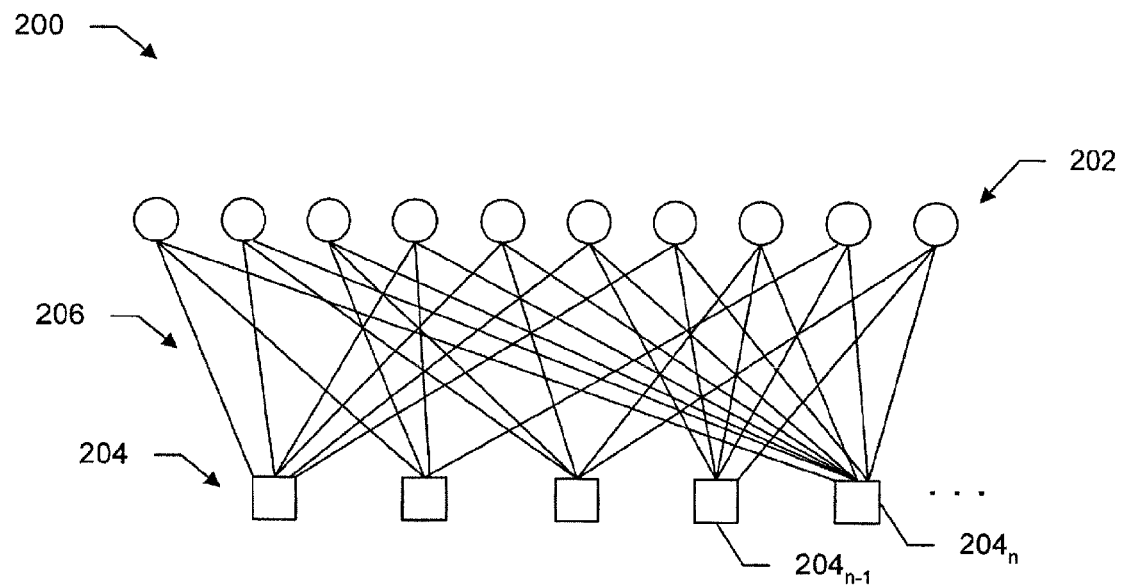
FIGS. 2 and 3 are code graphs illustrating multiple weight LDPC codes.
Figure 3:
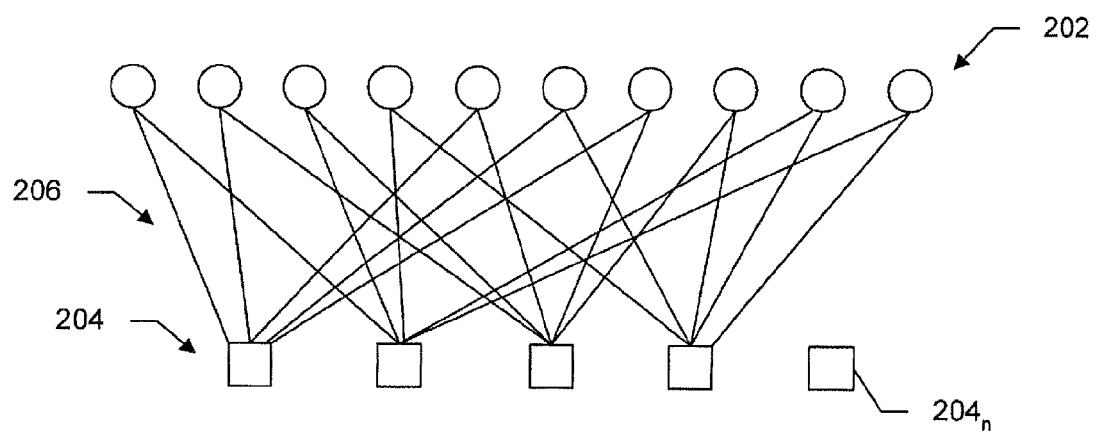

Before discussing the operations of the processor 106, we discuss the selectable variable node degree distribution LDPC codes with reference to FIGS. 2 and 3. The LDPC codes utilized in the LDPC decoder 104 are depicted as a Tanner graph 200. A plurality of variable nodes $202_i$ (collectively referred to by reference numeral 202) correspond to code word symbols, or vectors of symbols, and a plurality of constraint nodes $204_j$ (collectively referred to by reference numeral 204) correspond to parity constraints. The variable nodes and the constraint nodes are interconnected by edges $206_k$ (collectively referred to by reference numeral 206). As shown, the LDPC code has a variable node degree distribution in which 100 percent of the variable nodes have degree three, which is indicated by the three edges connecting to the respective variable nodes $202_i$. The LDPC codes may have variable node distributions in which one or more of the variable nodes have different degrees, such as 20 percent degree four nodes and 80 percent degree three nodes, and so forth. For ease of understanding, we describe the exemplary system below in terms of an LDPC code in which the variable nodes are 100 percent degree three nodes.

The LDPC code further includes several degree five constraint nodes $204_1, 204_2 \ldots 204_{n-1}$ and one or more higher degree parity constraint nodes $204_n, 204_{n+1} \ldots 204_{n+t}$. Note that edges interconnect each of the variable nodes 202 with one or more of the higher degree constraint nodes. While variable node degree distribution codes having degree three variable nodes and degree two variable nodes are shown in FIGS. 2 and 3 for ease of illustration, any variable node degree distribution codes may be utilized. As discussed above, a given code may include respective variable nodes of different degrees.

In certain applications, for example, lower variable node degree distribution LDPC codes outperform higher variable node degree distribution LDPC codes. One such application is magnetic recording channels, with the lower variable node degree distribution code having better dB performance even when the code uses fewer parity constraints than the higher variable node degree distribution code. For such applications, the processor 106 disables the higher degree constraint nodes $204_n, 204_{n+1} \ldots 204_{n+1}$ to operate first with the lower variable node degree distribution code With reference to FIGS. 1 and 3, the decoder 104 operates with a lower variable node degree distribution code, illustrated as a code with degree two variable nodes 202, since the higher degree constraint node $204_n$ is disabled. Alternatively, the processor disables the edges 206 (FIG. 2) that interconnect the variable nodes to the higher degree constraint node $204_n$, which has the same effect during decoder iterations.

In the example discussed above, the decoder 104 performs a predetermined number of decoder iterations using the lower variable node degree distribution LDPC code, and checks for convergence. If the code word data do not converge, the decoder may send updated soft information to the detector 102. The detector then further updates the soft information and returns the information to the decoder in a known manner.

For the next decoder iterations or later decoder iterations, the processor 106 enables the disabled constraint nodes $204_n$, $204_{n+1} \ldots 204_{n+t}$, and the decoder then performs the decoder iterations using the higher variable node degree distribution LDPC code. The system thus takes advantage of the lower error floor of the higher variable node degree distribution code for the next decoder iterations. The decoder performs up to a predetermined number of decoder iterations with the higher variable node degree distribution code, and again checks for convergence. The decoder may, as appropriate, provide updated soft information to the detector, and so forth.

In another example, the processor 106 may enable the disabled constraint nodes $204_n, 204_{n+1} \ldots 204_{n+t}$ after a predetermined number of decoder iterations, e.g., after 15 out of 20 iterations, have been performed with the lower variable node degree distribution code. The decoder 104 then completes its decoder iterations using the higher variable node degree distribution code. Thereafter, the decoder may exchange updated soft information with the detector 102, to begin a next number of decoder iterations. Thus, the different variable node degree distribution codes may be used between global iterations, i.e., between decoder/detector iterations, in a system with a synchronous detector, or while the detector updates in a system with an asynchronous detector.

Alternatively, the processor 106 may enable the disabled constraint nodes $204_n, 204_{n+1} \ldots 204_{n+t}$ when the code word convergence rate is above a predetermined rate.

The processor 106 may selectively enable or disable subsets of the constraint nodes $204_n, 204_{n+1} \ldots 204_{n+t}$, such that the decoder 104 operates with various variable node degree distribution codes during respective decoder iterations. The processor 106 may selectively enable or disable selected constraint nodes to utilize an LDPC code that provides desired capabilities, such as better burst error performance when, for example, burst errors are indicated during error recovery operations. Alternatively, the system may enable the disabled constraint nodes only during re-read or error recovery operations and decode on the fly with the lower variable node degree distribution code.

Figure 4:
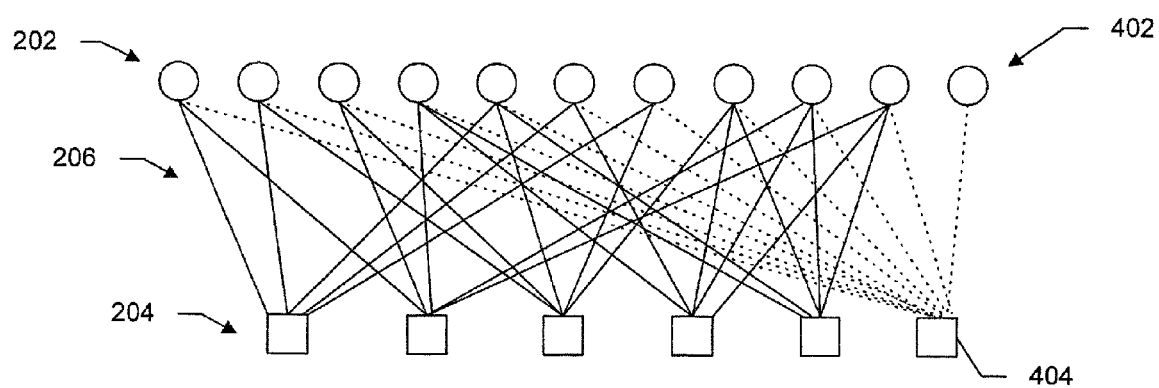
FIG. 4 is a code graph illustrating multiple weight LDPC and SPC codes.

Referring now to FIG. 4, the codes utilized for decoding may be a variable node degree distribution LDPC code that is represented by variable nodes 202 and constraint nodes 204 and one or more concatenated single parity codes (SPCs) that are represented in the drawing as a variable node 402 and a parity constraint node 404. The SPC variable node connects only to the SPC constraint node, which connects also to each of the variable nodes 202, such that the respective variable nodes 202 have degree x+1, while the SPC variable node 402 has a degree of 1. The SPC functions to clear the error floor, and is used in later decoder iterations as needed. Various variable node degree distribution SPCs may be utilized, with the inclusion of appropriate numbers of additional SPC variable and parity constraint nodes 402 and 404. When more than 1 SPC is used, the SPCs essentially divide up the LDPC code variable nodes 202. The system may utilize respective SPCs for particular decoding operations by enabling and disabling different ones of the SPC constraint nodes 404, which also disables the corresponding SPC variable nodes 402 and the corresponding edges leading to the associated LDPC code variable nodes.

For a predetermined number of decoder iterations or until an appropriate code word convergence rate is achieved, the processor 106 operates the decoder 104 with the SPC parity constraint node 404 disabled, such that the decoder uses only the LDPC code. The processor then enables the SPC parity constraint node, such that the decoder then uses both the LDPC and the SPC codes in the decoder iterations. Note that the decoder utilizes a lower density code or codes first, and higher density code or codes in later decoder iterations.

Figure 5:
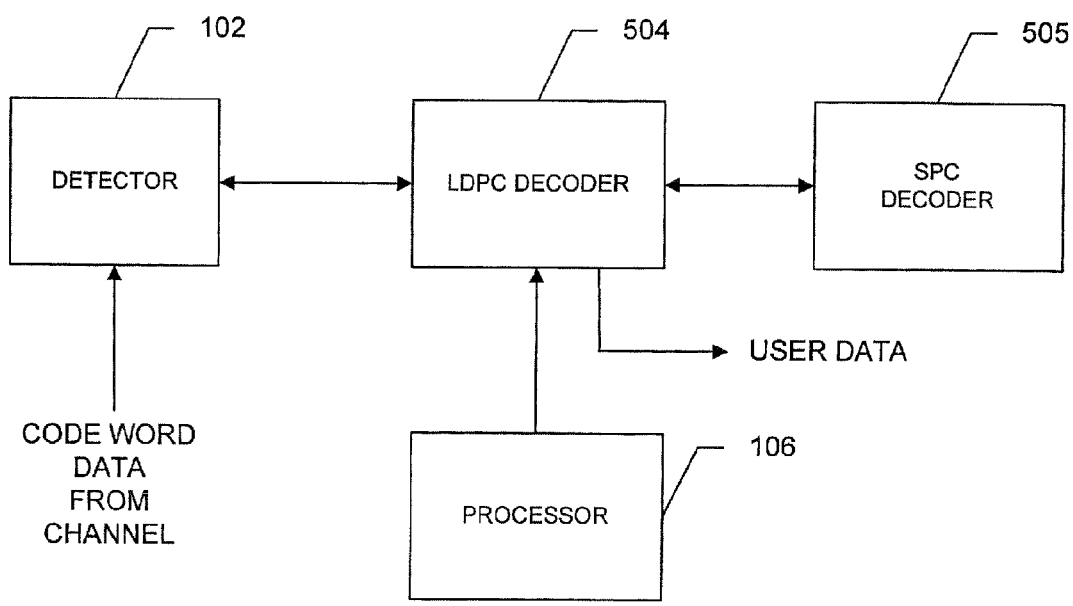
FIG. 5 is a functional block diagram of an alternative decoding system constructed in accordance with the invention.

Separate decoder hardware may be employed if the higher variable node degree distribution code includes an outer linear code. Thus, as illustrated in FIG. 5, the SPC operation may be performed in a separate SPC decoder 505. The SPC decoder communicates with an LPDC decoder 504 that performs the LDPC decoding using the lower variable node degree distribution code. Once the LDPC decoder 504 has performed a predetermined number of decoder iterations, the LDPC decoder provides updated soft information to the SPC decoder 505, which performs the SPC decoding to update the information by detecting or correcting one or more errors. The SPC decoder then provides the updated information to the LDPC decoder 504, and the LDPC decoder utilizes the information in the start of a next decoder iteration. The LDPC decoder then supplies updated information to the SPC decoder for use in its operation, which is part of the same decoder iteration. The two decoders operate together in this manner for the remaining decoder iterations. Thereafter, the LDPC decoder 504 may provide the updated data to the detector 104, for further updating.

Alternatively, the SPC decoder 505 may be included in the ISI detector 104, with the processor enabling the SPC decoder at the start of the global iterations or at a later iteration when, for example, the code word convergence rate is sufficiently high. The SPC decoder is utilized in the global iterations, before updated soft information is provided from the detector to the LDPC decoder 504.

Referring again to FIG. 2, the constraint nodes $204_n$, $204_{n+1} \ldots 204_{n+t}$ that are associated with the higher variable node degree distribution codes generally have higher degrees than the constraint nodes associated with the lower variable node degree distribution code. The use of higher degree constraint nodes provides the advantage that fewer additional parity check symbols are required in the code words, and thus, required to be recorded on the storage media and/or transmitted through the channel. The contributions of the variable nodes should be distributed among the higher degree constraint nodes, and the higher degree constraint nodes utilized when few errors remain in the data. Otherwise, the higher degree additional parity constraints may not aid in convergence.

The processors or functions described herein can be implemented in software, firmware and/or hardware. The respective processors or functions may be performed by individual processors or groups of processors. Further, the processors or functions described or depicted separately may be combined in one or more processors or functions. Also, the codes described as one or more SPCs may be other codes that in combination with the LDPC code or codes result in higher density codes.

What is claimed is:

1. A decoding system comprising:
an iterative decoder that is characterized by a plurality of variable nodes and a plurality of parity constraint nodes,
a processor that at respective iterations disables one or more selected constraint nodes to operate the iterative decoder as a selected variable node degree distribution decoder for a number of iterations and during other iterations enables one or more of the selected constraint nodes to operate the iterative decoder with one or more higher variable node degree distribution codes.

2. The decoding system of claim 1 wherein the selected variable node degree distribution code is a low density parity check code and the one or more higher variable node degree distribution codes are a combination of the low density parity check code and one or more single parity check codes.

3. The decoding system of claim 2 wherein the decoder further includes an intersymbol interference detector that performs the single parity check decoding as part of updating information used in the iterative decoding operations when the processor enables the associated selected constraint nodes.

4. The decoding system of claim 1 wherein the selected constraint nodes have higher degrees than other constraint nodes.

5. The decoding system of claim 1 wherein the processor disables the selected constraint nodes for a predetermine number of iterations and enables the selected constraint nodes for the remaining iterations.

6. The decoding system of claim 1 wherein the selected variable node degree distribution code and the higher variable node degree distribution codes are low density parity check codes.

7. The decoding system of claim 6 wherein the processor enables one or more of the selected constraint nodes during error recovery operations.

8. The decoding method of claim 1 wherein the processor enables one or more of the selected constraint nodes when a rate of code word convergence exceeds a predetermined rate.

9. A decoding method comprising the steps of:
disabling one or more selected constraint nodes and iteratively decoding using a selected variable node degree distribution code;
performing a number of decoder iterations;
enabling one or more of the selected constraint nodes; and
performing a further number of decoder iterations using a higher variable node degree distribution code.

10. The decoding method of claim 9 wherein the selected variable node degree distribution code is a low density parity check code and the higher variable node degree distribution code is a combination of the low density parity check code and one or more single parity check codes.

11. The decoding method of claim 9 wherein the step of disabling includes disabling the selected constraint nodes for a predetermine number of iterations, and the step of enabling includes enabling the selected constraint nodes for the remaining iterations.

12. The decoding method of claim 9 wherein the selected variable node degree distribution code and the higher variable node degree distribution codes are low density parity check codes.

13. The decoding method of claim 9 wherein the enabling step further includes enabling the one or more selected constraint nodes during error recovery operations.

14. The decoding method of claim 9 wherein the enabling step further includes enabling the one or more selected constraint nodes when a rate of code word convergence exceeds a predetermined rate.

15. A decoding system comprising
an iterative decoder that utilizes parity constraints to iteratively decode a block of data that consists of multiple code words;
a processor that controls the iterative decoder to selectively remove a subset of the parity constraints for a number of decoder iterations, the processor including one or more of the selectively removed parity constraints in other decoder iterations.

16. The decoding system of claim 15 wherein the iterative decoder is a low density parity check decoder with a selected variable node degree distribution when the subset of parity constraints are removed and a combination low density parity check decoder and a single parity code decoder when one or more of the subset of parity constraints are included.

17. The decoding system of claim 15 wherein the iterative decoder is a low density parity check decoder operating with a selected variable node degree distribution when the subset of parity constraints are removed and includes an intersymbol interference detector that performs the single parity check decoding as part of iterations with the low density parity check code when the processor enables the subset of parity constraints.

18. The decoding system of claim 15 wherein the subset of parity constraints have higher degrees than other parity constraints.

19. The decoding system of claim 15 wherein the processor disables the subset of parity constraints for a predetermine number of decoding iterations and enables the subset of parity constraints for the remaining iterations.

20. The decoding system of claim 15 wherein the iterative decoder operates with a selected variable node degree distribution low density parity check code when the subset of parity constraints are removed and one or more higher variable node degree distribution low density parity check codes when the subset of parity constraints are included.

21. The decoding system of claim 15 wherein the processor includes the subset of parity constraints during error recovery operations.

22. The decoding system of claim 15 wherein the iterative decoder includes a second decoder that operates when one or more of the subset of parity constraints are enabled and a first decoder the operates with the selected variable node degree distribution code.

* * * * *